United States Patent
Mallikarjunaswamy

(10) Patent No.: US 9,548,307 B2
(45) Date of Patent: Jan. 17, 2017

(54) COMPACT CMOS DEVICE ISOLATION

(71) Applicant: Alpha and Omega Semiconductor Incorporated, Sunnyvale, CA (US)

(72) Inventor: Shekar Mallikarjunaswamy, San Jose, CA (US)

(73) Assignee: Alpha and Omega Semiconductor Incorporated, Sunnyvale, CA (US)

(*) Notice: Subject to any disclaimer, the term of this patent is extended or adjusted under 35 U.S.C. 154(b) by 215 days.

(21) Appl. No.: 14/320,451

(22) Filed: Jun. 30, 2014

(65) Prior Publication Data

US 2015/0380413 A1    Dec. 31, 2015

(51) Int. Cl.
| | | |
|---|---|---|
| H01L 27/092 | (2006.01) | |
| H01L 21/8238 | (2006.01) | |
| H01L 21/761 | (2006.01) | |
| H01L 29/10 | (2006.01) | |

(52) U.S. Cl.
CPC ......... *H01L 27/0928* (2013.01); *H01L 21/761* (2013.01); *H01L 21/823878* (2013.01); *H01L 21/823892* (2013.01); *H01L 29/1083* (2013.01)

(58) Field of Classification Search
CPC .......... H01L 21/761; H01L 21/823493; H01L 27/098; H01L 21/823892; H01L 27/0262; H01L 27/0928; H01L 29/0692; H01L 27/0922; H01L 29/41758; H01L 29/4238; H03F 3/213; H03F 3/301
See application file for complete search history.

(56) References Cited

U.S. PATENT DOCUMENTS

| | | | | |
|---|---|---|---|---|
| 6,218,691 B1* | 4/2001 | Chung | ............. | H01L 27/14601 257/290 |
| 7,394,133 B1* | 7/2008 | Vashchenko | ........ | H01L 27/0262 257/355 |
| 8,324,707 B2* | 12/2012 | Sasaki | ............ | H01L 21/823493 257/504 |
| 2004/0222449 A1* | 11/2004 | Koyama | .......... | H01L 27/14603 257/292 |
| 2005/0014324 A1 | 1/2005 | Williams et al. | | |
| 2005/0110574 A1* | 5/2005 | Richard | .................. | H03F 3/301 330/297 |
| 2005/0255625 A1* | 11/2005 | Janesick | ........... | H01L 27/14609 438/57 |
| 2006/0267053 A1* | 11/2006 | Yang | ................ | H01L 27/14609 257/291 |
| 2007/0178568 A1* | 8/2007 | Laviolette | ................. | C12P 7/06 435/161 |

(Continued)

*Primary Examiner* — Bac Au
(74) *Attorney, Agent, or Firm* — Van Pelt, Yi & James LLP

(57) ABSTRACT

An integrated circuit includes a first well of the first conductivity type formed in a semiconductor layer where the first well housing active devices and being connected to a first well potential, a second well of a second conductivity type formed in the semiconductor layer and encircling the first well where the second well housing active devices and being connected to a second well potential, and a buried layer of the second conductivity type formed under the first well and overlapping at least partially the second well encircling the first well. In an alternate embodiment, instead of the buried layer, the integrated circuit includes a third well of the second conductivity type formed in the semiconductor layer where the third well contains the first well and overlaps at least partially the second well encircling the first well.

22 Claims, 6 Drawing Sheets

(56) References Cited

U.S. PATENT DOCUMENTS

| | | | | |
|---|---|---|---|---|
| 2012/0008242 A1* | 1/2012 | Salcedo | ............. | H01L 27/0259 |
| | | | | 361/56 |
| 2014/0071315 A1* | 3/2014 | Miyazaki | ............. | H04N 5/2354 |
| | | | | 348/241 |
| 2014/0138735 A1* | 5/2014 | Clarke | ................ | H01L 29/0692 |
| | | | | 257/124 |
| 2015/0318273 A1* | 11/2015 | Lue | .................... | H01L 27/0266 |
| | | | | 257/296 |
| 2015/0349186 A1* | 12/2015 | Hsu | .................... | H01L 31/1129 |
| | | | | 257/291 |

* cited by examiner

US 9,548,307 B2

COMPACT CMOS DEVICE ISOLATION

BACKGROUND OF THE INVENTION

Monolithic Power Integrated Circuits (PICs) for high-voltage applications may sometimes integrate thereon analog and digital circuitry. For example, one type of power integrated circuits is a DC-to-DC converter which may integrate the controller and one or both of the power switches on a single integrated circuit. As thus integrated, CMOS devices forming the analog circuits in the power integrated circuit need to be isolated from the noisy substrate to avoid circuit malfunction due to noise. In particular, the analog circuits typically include sensitive circuitry such as bandgap, amplifier and sensing circuits. The digital circuits typically include the oscillator, logic circuitry and the PWM controller. Conventional power integrated circuit includes separate ground connection for the analog circuits (analog ground) and for the digital circuits (digital ground). The substrate of the power integrated circuit, typically a P-type substrate, is typically connected to the digital ground which tends to be noisy due to the switching action of the digital clocking circuitry. The sensitive CMOS analog circuits of the power integrated circuit need to be isolated from the P-type substrate and the noisy digital ground.

In the CMOS analog circuits, PMOS devices are self-isolated from the P-type substrate by the virtue of being formed in N-wells. However, NMOS devices are formed in P-wells and are thus directly connected to the P-type substrate if not isolated. Conventional power integrated circuits isolate the CMOS devices from the P-substrate by using an N-type buried layer ("N-buried layer") and deep N-well ring connected to the N-type buried layer. FIGS. 1 and 2 illustrate the conventional CMOS device isolation structure in an integrated circuit. Referring to FIGS. 1 and 2, an integrated circuit 1 is typically formed using one or more circuit blocks 1-3, each circuit block housing analog or digital circuits. In the example shown, each of the circuit blocks 1-3 is isolated by a CMOS device isolation structure including a deep N-well ring 5 and an N-type buried layer 14 underlying the entire area within the circuit block defined by the ring 5. As shown in the example circuit block 10 of FIG. 2, the N-buried layer 14 extends across the entire area under the circuit block between the deep N-well ring 5. PMOS and NMOS devices are then formed in respective N-well 18 and P-well 20 in the epitaxial layer 13 above the N-buried layer 14. As thus configured, the PMOS and NMOS devices are completely enclosed by the deep N-well ring 5 and the N-buried layer 14 and are thus isolated from the P-type substrate 12 which is typically connected to the digital ground. Although it is more critical to isolate the analog circuit blocks from the noisy P-type substrate, conventional integrated circuits typically isolate both the analog and the digital circuit blocks to keep the substrate less noisy which results in lower noise coupling from substrate to analog blocks.

Although the conventional CMOS device isolation structure is effective, the isolation structure takes up large amount of silicon area because of the use of the deep N-well ring. Deep N-well is typically associated with large out-diffusion. Therefore, it is necessary to have a large spacing between adjacent deep N-wells. Thus, the die size for the integrated circuit formed using the conventional CMOS device isolation structure tends to be large, increasing the cost of the integrated circuit.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a compact CMOS device isolation scheme in a CMOS integrated circuit forms a ring of N-well housing PMOS devices to encircle the P-well housing NMOS devices in a circuit block and further forms a buried layer primarily under the P-well. In other words, the P-well in which the NMOS devices are formed is encircled by the N-well in which PMOS devices are formed. An N-type buried layer is formed under the P-well and extends partially under the surrounding N-well. The compact CMOS device isolation scheme eliminates the use of a deep N-well ring around the circuit block. Therefore, the circuit blocks of the integrated circuit can be formed with reduced silicon area and the die size for implementing the integrated circuit is reduced.

More specifically, the compact CMOS device isolation scheme of the present invention provides isolation of the NMOS devices using an N-buried layer and the N-well of the surrounding PMOS devices. The PMOS devices are self-isolated by virtue of being formed in an N-well. In this manner, effective device isolation can be achieved without the need to use a deep N-well ring which consumes large silicon area.

Figure 3:
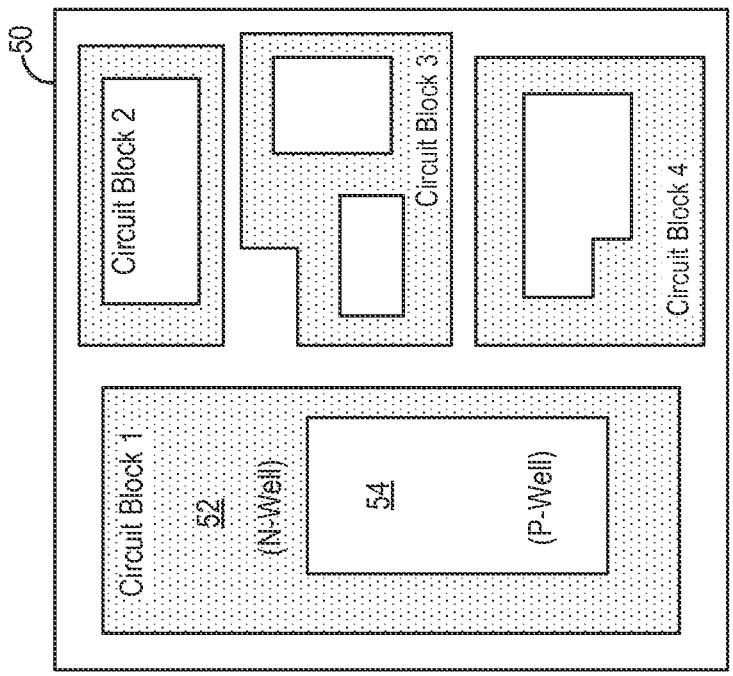
FIG. 3 is a top view of a CMOS integrated circuit implementing the compact CMOS device isolation structure according to embodiments of the present invention.
Figure 1:
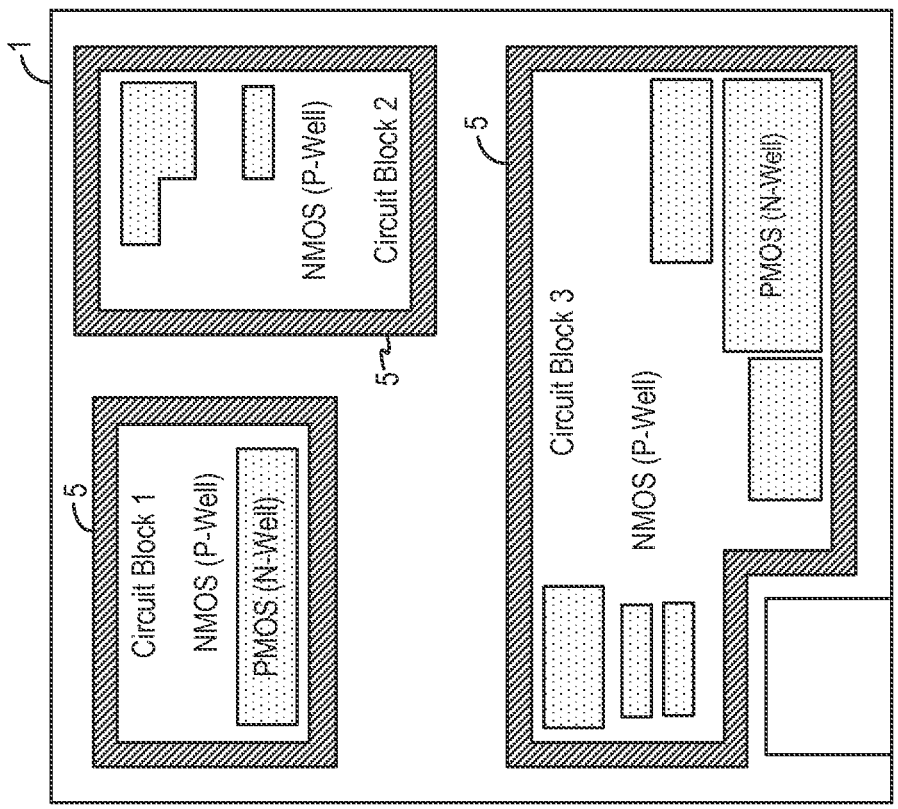
FIG. 1 is a top view of a conventional power integrated circuit including conventional CMOS device isolation structure.
Figure 2:
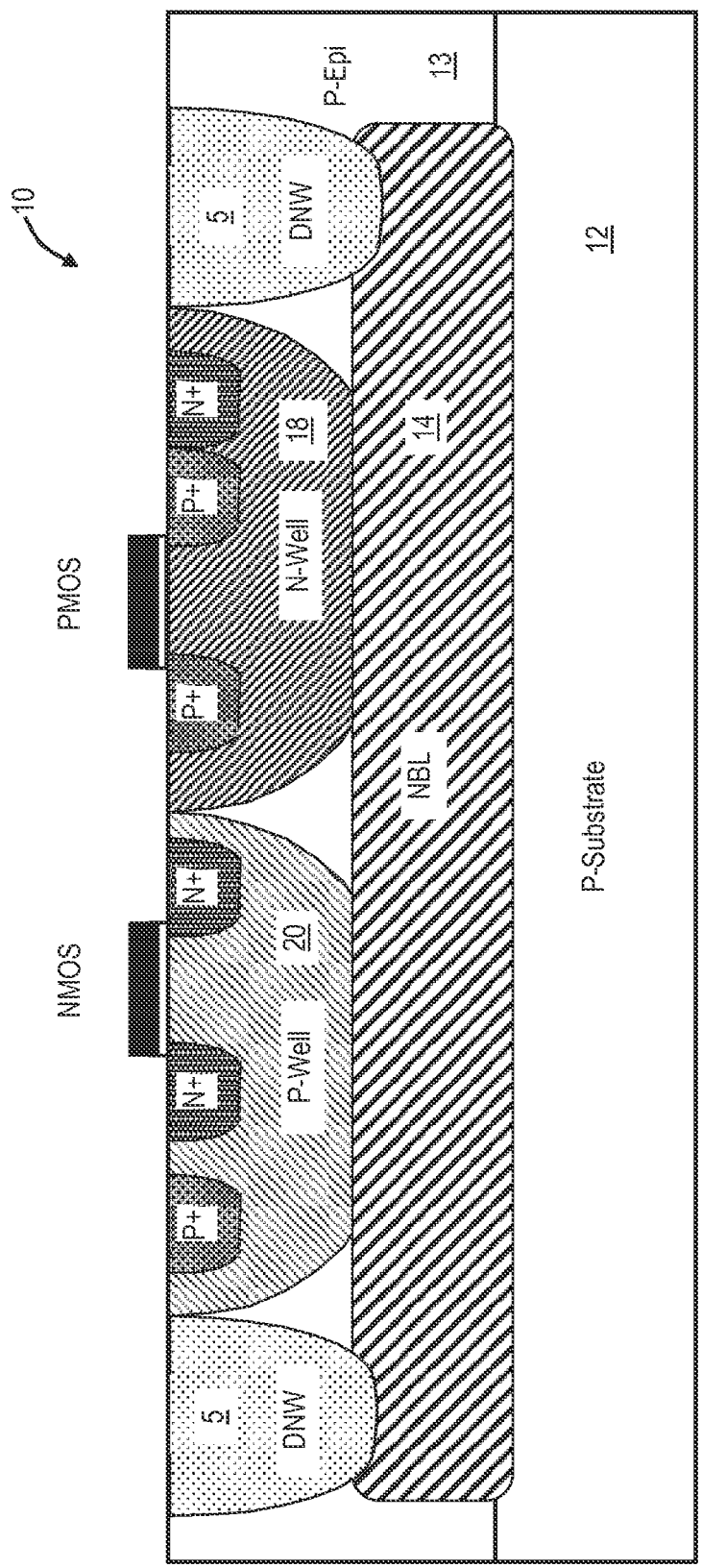
FIG. 2 is a cross-sectional view of a circuit block formed using the conventional CMOS device isolation structure.

FIG. 3 is a top view of a CMOS integrated circuit implementing the compact CMOS device isolation structure according to embodiments of the present invention. Referring to FIG. 3, a CMOS integrated circuit 50 includes circuit blocks 1-4 housing where each circuit block houses analog circuits or digital circuits and each circuit block houses PMOS and NMOS devices interconnected to form the respective digital or analog circuits. PMOS devices are formed in N-wells 52 while NMOS devices are formed in P-wells 54. In embodiments of the present invention, in each circuit block, a P-well 54 in which NMOS devices are formed is encircled by an N-well 52 in which PMOS devices are formed. NMOS devices formed in P-well 54 are further isolated from the substrate by an N-type buried layer (not shown). In this manner, no deep N-well ring is needed for device isolation and the circuit blocks of the integrated circuit can be formed using a smaller silicon area. The compact CMOS device isolation scheme reduces the silicon area needed for device isolation, thereby reducing the die size and the cost of the integrated circuit 50.

In embodiments of the present invention, the compact CMOS device isolation structure is applied for both analog circuit blocks and digital circuit blocks. Isolation of analog circuit blocks is important because the sensitive analog circuits formed therein need to be isolated from the noisy substrate, often connected to the digital ground. Isolation of the digital circuit blocks can be advantageous to keep the substrate less noisy which results in lower noise coupling from substrate to analog blocks.

Figure 4:
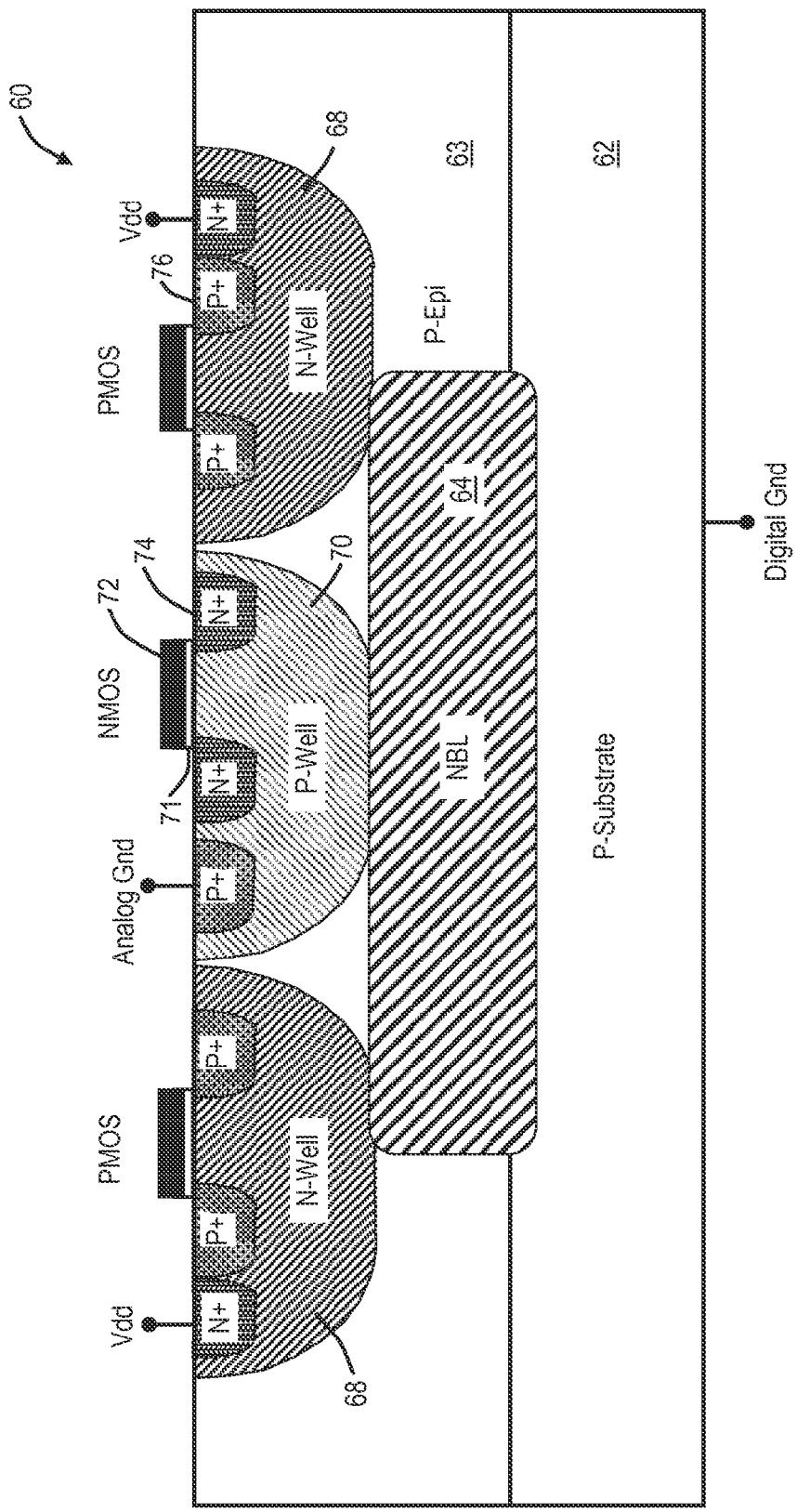
FIG. 4 is a cross-sectional view of a circuit block of an integrated circuit formed using the compact CMOS device isolation structure according to embodiments of the present invention.

FIG. 4 is a cross-sectional view of a circuit block of an integrated circuit formed using the compact CMOS device isolation structure according to embodiments of the present invention. In the following description, the same reference numerals are used to refer to the same type of diffusion regions or the same type of layers in the integrated circuit. Referring to FIG. 4, a circuit block 60 may be formed on an integrated circuit, such as the integrated circuit 50 of FIG. 3, and may be an analog circuit block or a digital circuit block. In the present example, the circuit block 60 is assumed to be an analog circuit block. The circuit block 60 is formed in a semiconductor layer including a P-type substrate 62 and a P-type epitaxial layer 63. To implement the compact CMOS device isolation structure of the present invention, the circuit block 60 includes a ring of N-well 68 formed on the periphery of the circuit block and encircling P-well 70 and an N-type buried layer 64 is formed under the P-well 70. The N-type buried layer 64 extends partially under the surrounding N-well 68 along the periphery of the circuit block.

In the present description, N-well 68 is sometimes referred to as an "N-well ring" to denote a closed loop well structure. It is understood that the N-well does not have to be in the shape of a circular ring but can be in any shape suitable to enclose the P-well within.

In circuit block 60, PMOS devices are formed in the N-well 68 while NMOS devices are formed in the P-well 70. For example, in the present embodiment, PMOS transistors are formed in N-well 68 and include heavily doped P+ region 76 as the source and drain regions and a conductive gate electrode 72 insulated from the semiconductor layer by a gate dielectric 71. PMOS devices can be formed anywhere in the periphery N-well 68 that encircles the P-well 70. The N-well 68 is not a dedicated isolation structure but rather is an active region in which active devices are formed. In the present description, active devices refer to transistors, resistors, capacitors and inductors or other circuit elements used to construct circuitry of the integrated circuit and is distinguishable from structures and elements used purely for non-functional purposes, such as isolation or for fabrication process alignment.

Furthermore, in the present embodiment, NMOS transistors are formed in N-well 68 and include heavily doped N+ region 74 as the source and drain regions and a conductive gate electrode 72 insulated from the semiconductor layer by a gate dielectric 71. When circuit block 60 is an analog circuit block, the P-well 70 housing the NMOS devices is connected to the analog ground connection. Meanwhile the P-type substrate 62 on which the circuit block is formed is connected to the digital ground connection.

As thus configured, the PMOS devices formed in the N-well 68 are self-isolated by virtual of being formed in an N-well in the P-type epitaxial layer 63. N-well 68 is connected to the positive power supply voltage Vdd while the P-type semiconductor layer, formed by the P-substrate and the P-type epitaxial layer 63, is connected to the digital ground. Therefore, the N-well to P-substrate junction is reversed biased and thus isolated. On the other hand, the P-well 70 is isolated from the P-type substrate 62 by the surrounding N-well 68 and the N-buried layer 64. In this manner, the analog ground connection is isolated from the noisy digital ground connection. Noise in the digital ground connection does not get coupled to the sensitive analog ground and analog circuitry formed in circuit block 60.

Figure 5:
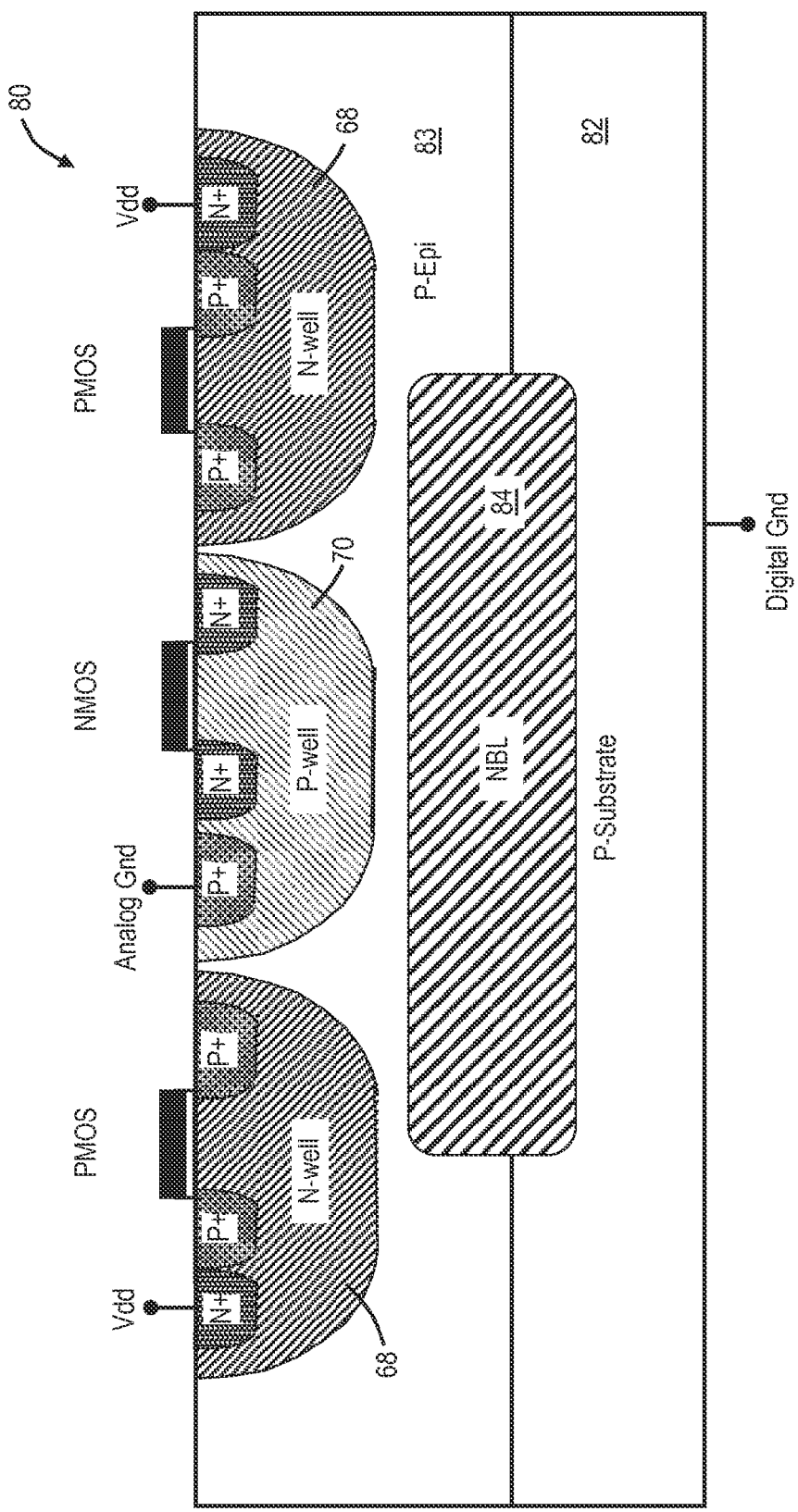
FIG. 5 is a cross-sectional view of a circuit block of an integrated circuit formed using the compact CMOS device isolation structure according to alternate embodiments of the present invention.

In the present embodiment, the N-well 68 and the N-type buried layer 64 are merged. That is, the N-well 68 is in contact with N-type buried layer 64 and thus the two regions are directly electrically connected. In other embodiments, the N-type buried layer is formed in proximity to, but not merged or in contact with, the N-well ring, as shown in FIG. 5. Referring to FIG. 5, in a circuit block 80, the NMOS devices are formed in the P-well 70 which is surrounded by an N-well ring 68. In the present embodiment, an N-type buried layer 84 is formed under the P-well 70 to isolate the P-well but the N-type buried layer is formed in close proximity to, but not merged with, the N-well ring 68. The N-buried layer 84 may be left floating. Although the N-buried layer 84 and the N-well ring 68 are not directly connected, the two regions are weakly connected through the depletion region formed between the two regions. More specifically, even when the N-buried layer 84 is not biased, built-in potential in the buried layer will cause a depletion region to be formed around the N-buried layer. The depletion regions formed around the N-buried layer 84 and the biased N-well ring 68 will merge and electrically connect the two regions. In this manner, even though the N-buried layer 84 does not merge with the N-well ring 68, isolation of the P-well from the substrate is still realized by the electrical connection of the N-buried layer 84 and the N-well ring 68 through depletion regions.

In some embodiments, even if the N-well ring 68 and the N-buried layer 84 are not merged by the depletion region, as long as the separation between the two regions are small, the N-well ring 68 and the N-buried layer 84 will effectively pinch the P-epitaxial layer 83 so that the resistance between the P-well 70 and the P-substrate 62 is increased. In this manner, the N-well ring 68 and the N-buried layer 84 provides adequate electrical isolation to the P-well 70 (connected to the analog ground) and the P-substrate 62 (connected to the digital ground).

In the embodiments shown in FIGS. 4 and 5, the N-buried layer is formed under the P-well and only overlaps the N-well ring partially. In other embodiments, the N-buried layer can be formed coincidence with the N-well ring 68. In some cases, when compact die size is desired, it is advantageous to pull the N-buried layer back from the N-well ring edge as the N-buried layer has more out-diffusion and therefore requires a larger spacing between buried layers than the required spacing between N-wells.

Figure 6:
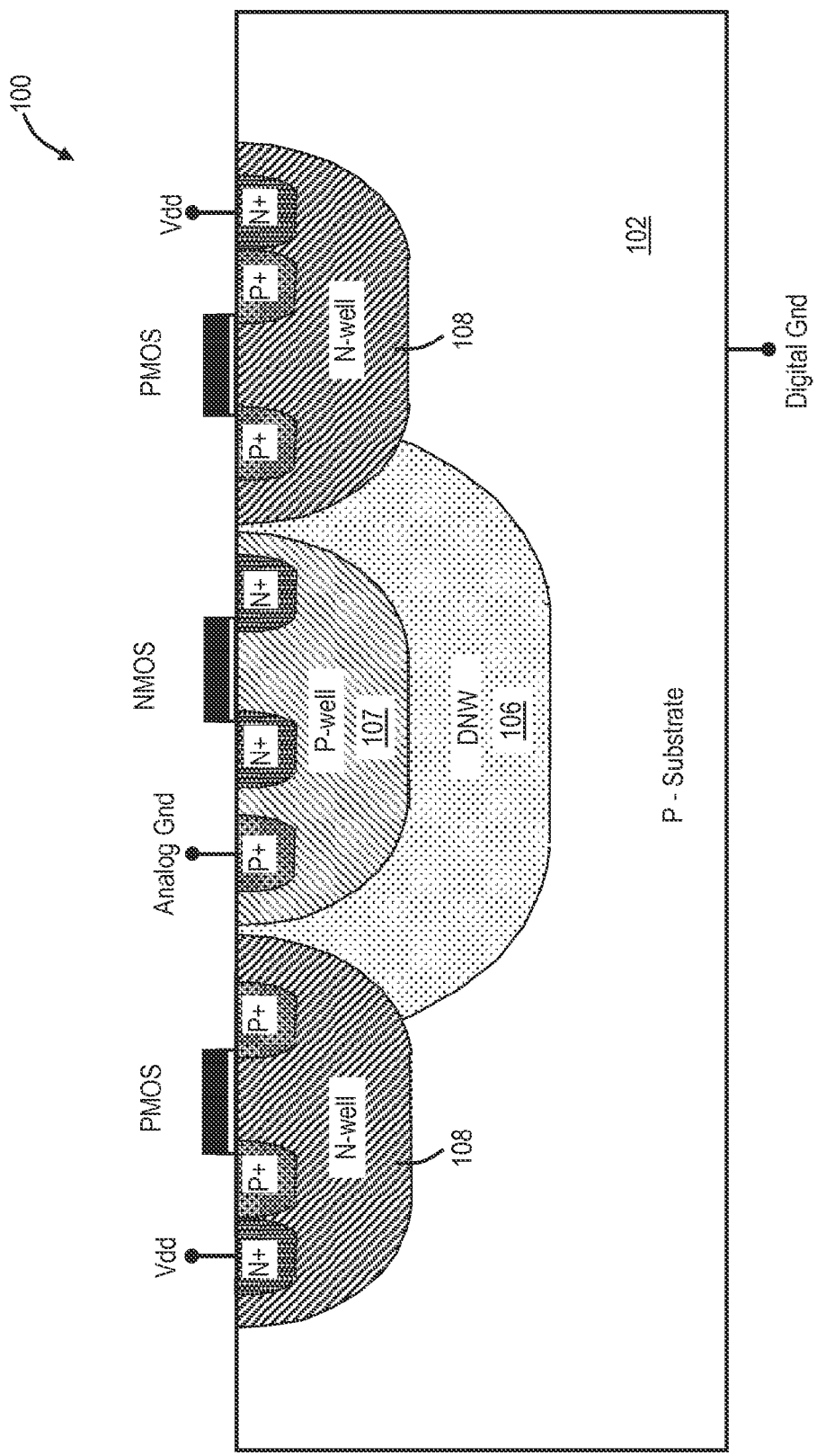
FIG. 6 is a cross-sectional view of a circuit block of an integrated circuit formed using the compact CMOS device isolation structure according to alternate embodiments of the present invention.

FIG. 6 is a cross-sectional view of a circuit block of an integrated circuit formed using the compact CMOS device isolation structure according to alternate embodiments of the present invention. In some cases, the integrated circuit may be formed using a non-epitaxial process and thus buried layers are not available. In embodiments of the present invention, compact CMOS device isolation is realized by using a deep N-well that contains the P-well to be isolated and overlaps partially the surrounding N-well ring.

Referring to FIG. 6, a circuit block 100 is formed in an integrated circuit formed in a P-type substrate 102. In circuit block 100, PMOS devices are formed in the N-well 108 while NMOS devices are formed in the P-well 107. N-well 108 forms a ring to surround and encircle the P-well 107 for isolation. Because a buried layer is not available, the P-well 107 is formed in a deep N-well 106. In some embodiments, the deep N-well 106 is formed by performing ion implantation from the surface of substrate 102 and performing thermal drive-in to form the deep N-well 106. The deep N-well 106 overlaps at least partially the surrounding N-well ring 108. In this manner, the P-well 107 is isolated from the P-substrate 102. When the P-well 107 is connected to the analog ground and the P-substrate is connected to the digital ground, the N-well ring 108 and the deep N-well 106 provides isolation of the analog and digital ground connections.

Figure 7:
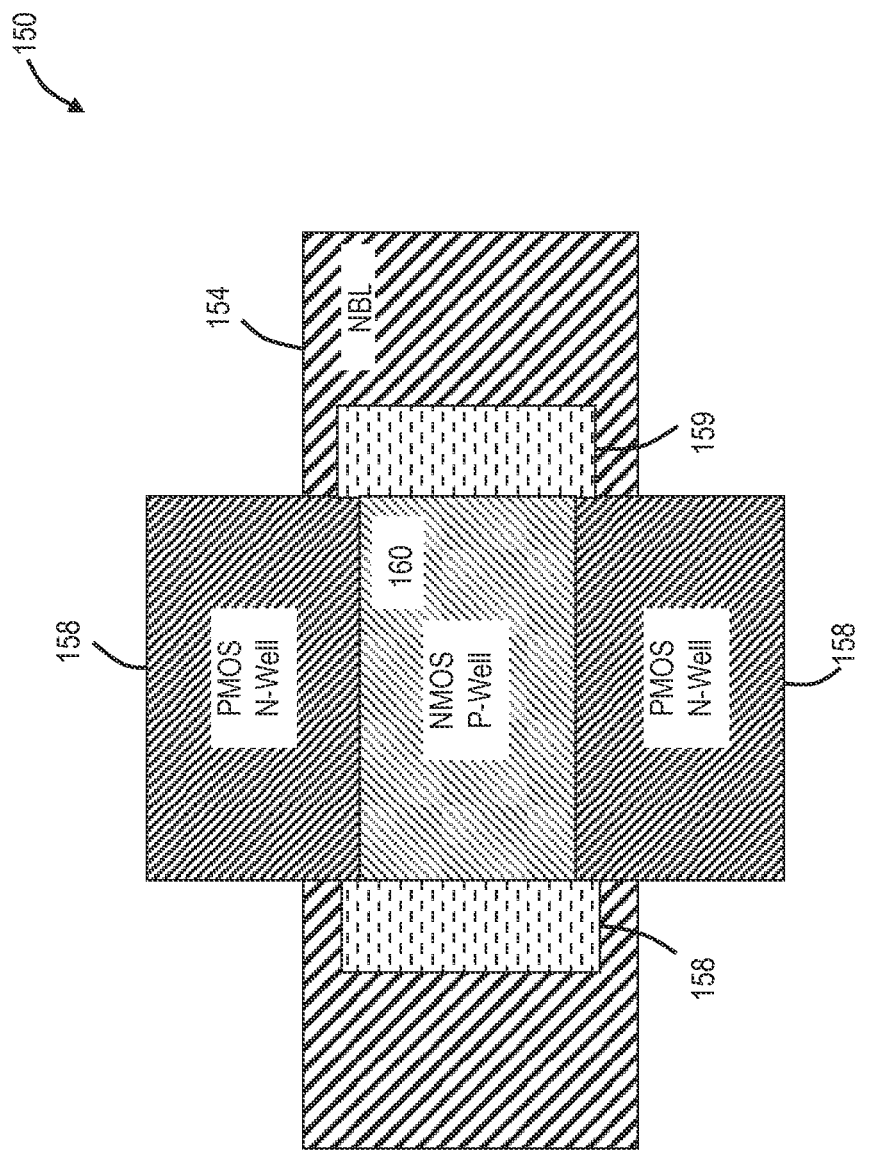
FIG. 7 is a top view of a P-well and N-well layout using the compact CMOS device isolation structure according to alternate embodiments of the present invention.

FIG. 7 is a top view of a P-well and N-well layout using the compact CMOS device isolation structure according to alternate embodiments of the present invention. Referring to FIG. 7, in a circuit block 150, it may not be possible to form an active N-well ring to surround the P-well for isolation. In that case, the P-well 160 may be formed bordered by active N-wells 158 on as many sides as possible. On the sides of the P-well 160 not bordered by an active N-wells 158, an N-well and deep N-well structure 159 may be formed. The deep N-well structure electrically connects to the underlying N-type buried layer 154. In this manner, isolation of P-well 160 can be achieved even though the P-well is not surrounded entirely by the active N-well.

In the above described embodiments, the integrated circuit is formed on a P-type substrate and the CMOS device isolation is applied to the P-well. In other embodiments, the integrated circuit may be formed on an N-type substrate and the compact CMOS device isolation scheme of the present invention can be applied to isolate the N-well in the integrated circuit.

In the above described embodiments, the integrated circuit is formed with the P-well isolated by the N-well being connected to an analog ground potential. In other embodiments, the P-well isolated by the N-well may be connected to other voltage values, including a voltage higher than the ground potential as long as there is reverse bias between the protected P-well and surrounding N-well and N-type buried layer.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An integrated circuit, comprising:
   a semiconductor layer of a first conductivity type and being lightly doped;
   a first well of the first conductivity type formed in the semiconductor layer, the first well housing active devices and being connected to a first well potential,
   a second well of a second conductivity type formed in the semiconductor layer and having a closed loop well structure to encircle the first well, the second well housing active devices and being connected to a second well potential; and
   a buried layer of the second conductivity type formed under the first well and the second well, the buried layer being formed overlapping at least partially the second well encircling the first well and the buried layer being formed under the second well to surround the periphery of the first well, the first well being isolated from the semiconductor layer by the second well and the buried layer surrounding the first well.

2. The integrated circuit of claim 1, wherein the buried layer is formed in contact with the second well around the periphery of the first well.

3. The integrated circuit of claim 1, wherein the buried layer is formed in the proximity of, but not in contact with, the second well surrounding the periphery of the first well, the first well being isolated from the semiconductor layer by the second well and the buried layer surrounding the first well and by a depletion region formed between the second well and the buried layer.

4. The integrated circuit of claim 1, wherein the buried layer is formed overlapping the entire second well around the periphery of the first well.

5. The integrated circuit of claim 1, wherein the semiconductor layer comprises:
   a semiconductor substrate of the first conductivity type; and
   an epitaxial layer of the first conductivity type formed on the semiconductor substrate,
   wherein the buried layer is formed on the semiconductor substrate.

6. The integrated circuit of claim 1, wherein the first well houses a MOS transistor of the second conductivity type as the active device.

7. The integrated circuit of claim 1, wherein the second well houses a MOS transistor of the first conductivity type as the active device.

8. The power integrated circuit of claim 1, wherein the first conductivity type is P-type and the second conductivity type is N-type.

9. The integrated circuit of claim 8, wherein the first well potential of the first well comprises a first ground potential and the semiconductor layer is electrically connected to a second ground potential, the first ground potential being isolated from the second ground potential by the second well and the buried layer.

10. The integrated circuit of claim 9, wherein the second well potential of the second well comprises a positive power supply voltage.

11. A method for forming an integrated circuit, comprising:

providing a semiconductor layer of a first conductivity type and being lightly doped;

forming a first well of the first conductivity type in the semiconductor layer, the first well housing active devices and being connected to a first well potential, forming a second well of a second conductivity type in the semiconductor layer and having a closed loop well structure to encircle the first well, the second well housing active devices and being connected to a second well potential; and forming a buried layer of the second conductivity type under the first well and the second well, the buried layer being formed overlapping at least partially the second well encircling the first well and the buried layer being formed under the second well to surround the periphery of the first well, the first well being isolated from the semiconductor layer by the second well and the buried layer surrounding the first well.

12. The method of claim 11, wherein forming a buried layer of the second conductivity type comprises:

forming the buried layer of the second conductivity type in contact with the second well around the periphery of the first well.

13. The method of claim 11, wherein forming a buried layer of the second conductivity type comprises:

forming the buried layer of the second conductivity type in the proximity of, but not in contact with, the second well surrounding the periphery of the first well, the first well being isolated from the semiconductor layer by the second well and the buried layer surrounding the first well and by a depletion region formed between the second well and the buried layer.

14. The method of claim 11, wherein forming a buried layer of the second conductivity type comprises:

forming the buried layer of the second conductivity type overlapping the entire second well around the periphery of the first well.

15. The method of claim 11, wherein providing a semiconductor layer of a first conductivity type and being lightly doped comprises:

providing a semiconductor substrate of the first conductivity type; and forming an epitaxial layer of the first conductivity type on the semiconductor substrate, wherein the buried layer is formed on the semiconductor substrate.

16. The method of claim 11, wherein the first well houses a MOS transistor of the second conductivity type as the active device.

17. The method of claim 11, wherein the second well houses a MOS transistor of the first conductivity type as the active device.

18. The method of claim 11, wherein the first conductivity type is P-type and the second conductivity type is N-type.

19. The method of claim 18, wherein the first well potential of the first well comprises a first ground potential and the semiconductor layer is electrically connected to a second ground potential, the first ground potential being isolated from the second ground potential by the second well and the buried layer.

20. The method of claim 19, wherein the second well potential of the second well comprises a positive power supply voltage.

21. An integrated circuit, comprising:

a semiconductor layer of a first conductivity type and being lightly doped;

a first well of the first conductivity type formed in the semiconductor layer, the first well housing active devices and being connected to a first well potential, a second well of a second conductivity type formed in the semiconductor layer and having a closed loop well structure to encircle the first well, the second well housing active devices and being connected to a second well potential; and a third well of the second conductivity type formed in the semiconductor layer, the third well containing the first well and overlapping at least partially the second well encircling the first well and the third well being formed to surround the periphery of the first well, the first well being isolated from the semiconductor layer by the second well and the third well surrounding the first well.

22. The integrated circuit of claim 21, wherein the third well comprises a deep well of the second conductivity type.

* * * * *